United States Patent [19]

Greenwood et al.

[11] Patent Number: 4,636,829

[45] Date of Patent: Jan. 13, 1987

[54] PHOTODETECTOR INTEGRATED CIRCUIT

[75] Inventors: John C. Greenwood, Harlow; George H. B. Thompson, Sawbridgeworth, both of England

[73] Assignee: ITT Industries, Inc., New York, N.Y.

[21] Appl. No.: 641,881

[22] Filed: Aug. 16, 1984

[30] Foreign Application Priority Data

Aug. 18, 1983 [GB] United Kingdom ................. 8322236

[51] Int. Cl.[4] ...................... H01L 27/14; H01L 31/00
[52] U.S. Cl. ....................................... 357/30; 357/22; 357/41; 357/55; 357/58
[58] Field of Search ....................... 357/30, 41, 40, 55, 357/22, 16, 61, 58

[56] References Cited

U.S. PATENT DOCUMENTS 4,442,445 4/1984 Malik et al. ............................ 357/22
4,517,581 5/1985 Thompson .............................. 357/30

Primary Examiner—James W. Davie
Assistant Examiner—Georgia Y. Epps
Attorney, Agent, or Firm—Donald J. Lenkszus

[57] ABSTRACT

An integrated circuit incorporates a PIN diode connected to the gate of an FET. The semiconductor layers used to construct the diode are also the layers used to construct the FET, and provide a relatively low capacitance per unit area for the diode compared with that of the gate of the FET.

30 Claims, 3 Drawing Figures

PHOTODETECTOR INTEGRATED CIRCUIT

BACKGROUND OF THE INVENTION

This invention relates to optical receivers, and in particular though not necessarily exclusively to optical receivers suitable for operation in optical fibre systems.

Typically photodetection in such systems relies upon the use of avalanche photodiodes or upon the combination of a PIN diode and a field effect transistor (PIN-FET combination) in which the output of the PIN diode is fed to the gate of an FET.

One of the limitations of a PIN-FET combination is the limitation set by noise considerations. The noise is proportional to the square root of the sum of the diode capacitance and the FET gate capacitance. Noise is therefore reduced and sensitivity enhanced if either or both of these capacitance values can be reduced.

British Patent Specification No. 2109991A now U.K. Pat. No. 2,109,991 corresponding to U.S. patent application Ser. No. 442,054 filed Nov. 16, 1982 and issued as U.S. Pat. No. 4,517,581 on May 14, 1985 and assigned to a common assignee describes an approach to this problem that involves a modification of the PIN FET combination in which the two components no longer exist as separate discrete entities but are combined in a manner affording low capacitance. In essence this involves ducting the light to the depletion region under the gate of a modified FET. The gate capacitance of this FET is proportional to the area of the gate, and this can be made small since the gate length is normally small anyway and the gate width can also be made relatively small. However, this approach then imposes significant constraints upon the shape of a beam of incident light that will be coupled efficiently into the depletion region, and there are also constraints involved in ensuring that that light is efficiently absorbed in that region.

SUMMARY OF THE INVENTION

The present invention is concerned with an alternative approach in which the diode and the FET exist as separately distinguishable entities in an integrated circuit. The construction provides the diode with a lower capacitance per unit area than the capacitance per unit area of the gate of the FET. This then enables the diode to be fabricated with an area larger than that of the FET gate without producing a capacitance to swamp the potentially low gate capacitance of an integrated circuit FET.

According to the present invention there is provided a photodetector integrated circuit incorporating a PIN photodiode (PIN-diode) connected to the gate of field effect transistor (FET), wherein the semiconductive layers from which the diode is constructed are also the layers from which the FET is constructed, and their construction is such as to provide the PIN-diode with a capacitance per unit area that is small compared with the gate capacitance of the FET per unit area of that gate.

In a conventional structure of compound semiconductor FET conduction between the source and drain takes place in a relatively high conductivity layer which in this specification is termed a channel layer. Beneath the channel layer is a low doped or semi-insulating region of semiconductive material that is typically not the material of the substrate upon which the device is grown, but is provided by an epitaxially grown layer than in this specification is termed a buffer layer. There is also a class of FET which has been designated by some a high electron mobility transistor (HEMT) and by others a two-dimensional electron gas field effect transistor (TEGFET), in which conduction takes place in a surface region of a layer of low doped material underlying a thin relatively highly doped layer. In view of the similarities between the layers in the two types of device (even though their functions are quite different in the two instances), for the purposes of this specification the relatively highly doped layer of a HEMT (TEGFET) will also be termed a channel layer and the underlying low doped layer will be termed a buffer layer notwithstanding the fact that the source drain current actually occurs in this underlying layer.

Preferably the semiconductive layers of the integrated circuit include an n-type layer that forms the channel layer of the FET and covers an $n^-$-type or semi-insulating buffer layer of greater thickness than the channel layer. Typically the buffer layer is approximately 1 micron thick and preferably it is made of a material that in the PIN diode will co-operate with the material channel layer in the absorption of light. For this purpose it should have a band gap that is less than that of any layer with which it is covered so as to enable it to be illuminated from above. Alternatively, if it is to be illuminated from beneath, the buffer layer band gap should be less than that of the substrate or of any layer between it and the substrate. This provides the diode with a combination of two layers for absorbing the light which may be made considerably thicker than the layer for channel conduction in the FET. This enables the FET to be designed with a thin channel layer suitably matching the short gate length required for high transconductance whilst the two absorbing layers of the diode are sufficiently thick in combination to intercept the majority of any light in the relevant range of wavelength that is incident normally on them.

BRIEF DESCRIPTION OF THE DRAWINGS

The invention will be better understood from a reading of the following detailed description in conjunction with the drawings in which.

DETAILED DESCRIPTION

Figure 1:
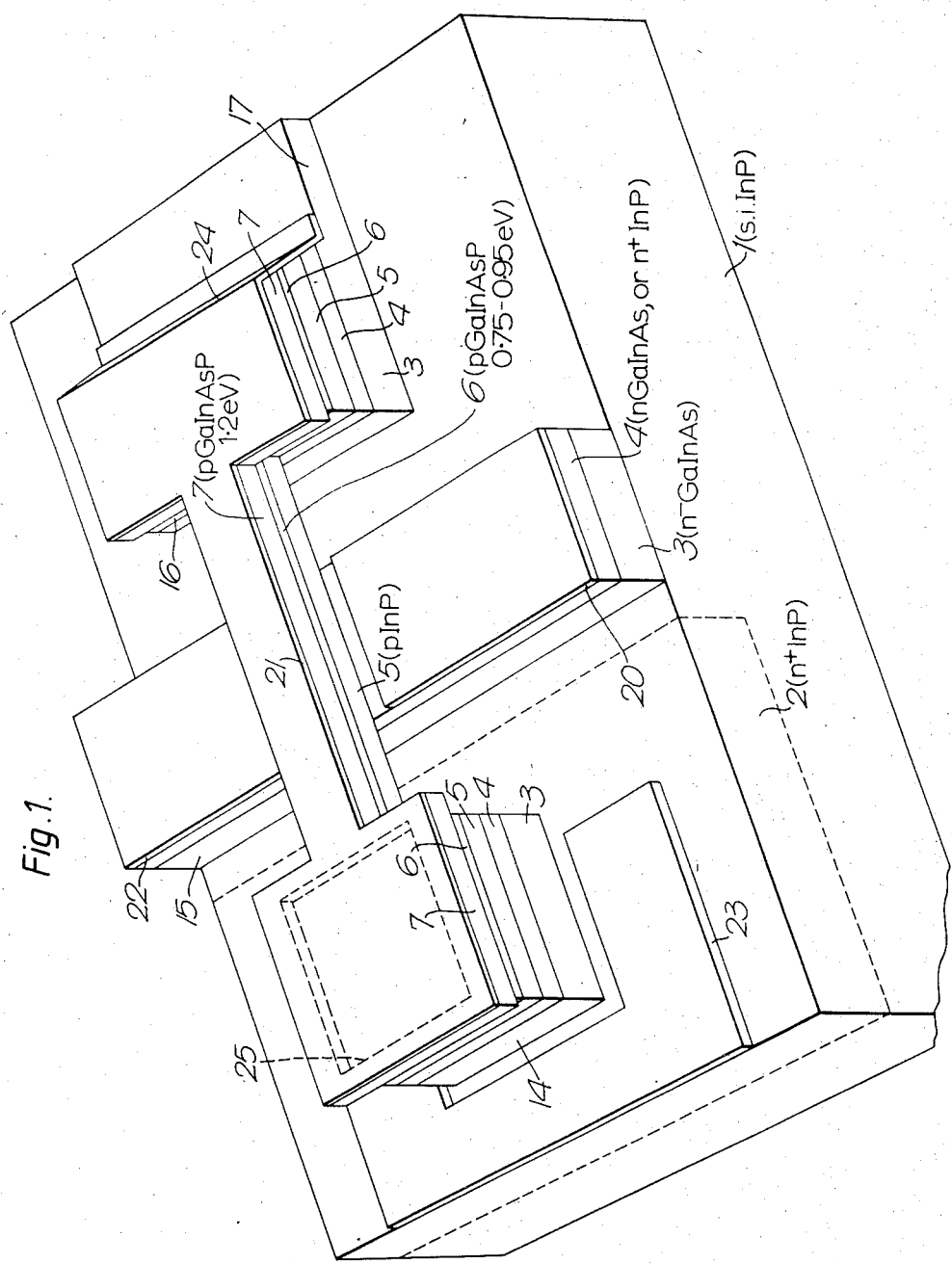
FIG. 1 is a schematic perspective view of an integrated circuit embodying the invention in two preferred forms.

A semi-insulating indium phosphide substrate 1 is provided with an n+ implanted region 2, which is later required for making electrical contact with the n-type side of the PIN photodiode. The substrate is then covered by a number of epitaxially grown layers.

The first layer to be grown is a layer 3 of $n^-$ or semi-insulating GaInAs. This will form the buffer layer of the FET, and also the main part of the depletion region of diode. This layer 3 is typically about 1 micron thick, and so is much thicker than the buffer layers of conventional FET's, which are typically about 0.05 microns thick. So far as the FET is concerned, this additional thickness is liable, if not semi-insulating, to increase the slope of the source/drain voltage/current characteristics, and also to increase the value of the gate voltage required to shut the device off. Neither of these effects is desirable in a general purpose FET, but both can be tolerated in this particular application. The greater thickness is required for the diode, where it not only provides sufficient depth for the efficient absorption of light incident upon the top surface, but also serves to provide an increased separation between the diode terminals and hence a lower capacitance per unit area of photosensor surface.

The next layer is to be grown is a layer 4. The composition and thickness of this layer depends upon the type of FET being constructed. Thus, if a HEMT (TEG-FET) is desired, layer 4 is an n+-type layer of InP typically 0.05 microns thick, whereas if the FET is of the more conventional type in which source drain current conduction occurs in the channel layer rather than in the buffer layer, it is an n-type layer of GaInAs typically 0.2 microns thick. Naturally this layer 4 is also present in the diode, where its effect is slightly, but not too significantly, deleterious in that it causes a slight reduction in the maximum voltage that can safely be applied across the diode without risk of inducing breakdown. For a HEMT type FET structure n+InAlAs can be substituted for n+InP as the material of layer 4.

Layer 4 is covered by layer 5, which is a p-type layer co-operating with layer 4 to form a p-n junction in both the FET and the PIN diode. Layer 5 is covered with two further p-type layers 6 and 7 whose composition is chosen in relation to that of layer 5 so as to enable the three layers to be etched in such a way as to produce undercutting so that self-aligning processing can subsequently be used for the provision of metal contacts for the three terminals of the FET, and optionally both terminals of the diode. For the range of lattice matched compositions from InP through GaInAsP to GaInAs there exist some etches that etch GaInAs, but whose etch rate is greatly reduced with increasing InP content to the extent that it is effectively zero by the time the band gap of the material has increased from about 0.75 eV (GaInAs) to somewhere in the region of 1.15 eV. Similarly there are other etches that etch InP, but whose etch rate is greatly reduced with increasing GaAs content to the extent that it is effectively zero by the time the band gap of the material has been reduced from 1.35 eV (InP) to somewhere in the region of 1.25 eV. An example of the former type of etch is a ferricyanide etch, whereas an example of the latter is a hydrochloric phosphoric acid etch. This leaves GaInAsP compositions with band gaps in the neighborhood of 1.2 eV resistant to both sets of etches. Layer 7 is therefore made of this etch resistant composition, while layer 6 is made of ternary or quanternary material satisfactorily etched by the ferricyanide type etches, and layer 5, being made of InP, is susceptible to etching by the hydrochloric phosphoric acid type etches. (Layer 5 can alternatively be made of quaternary material, provided the GaAs proportion is small enough.) Each of these three layers is typically about 0.3 microns thick.

Figure 2:
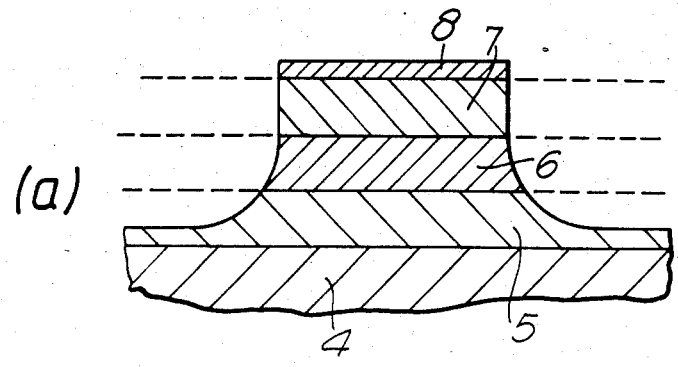
FIG. 2 shows in schematic cross-section successive stages in an etching procedure employed in the manufacture of the integrated circuit of FIG. 1.
Figure 2:
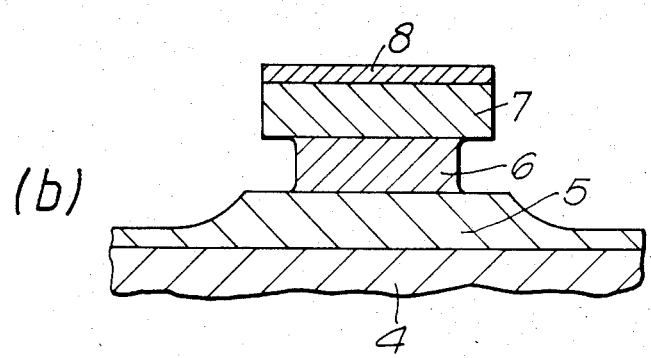
Figure 2:
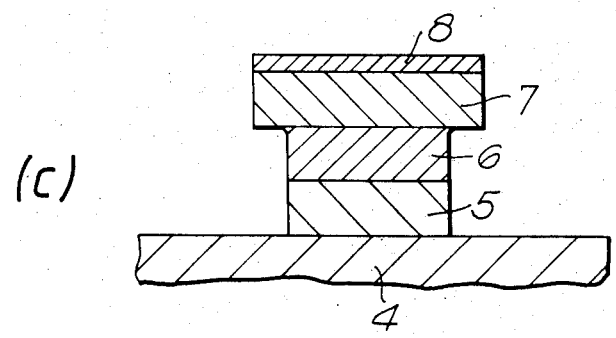
Figure 2:
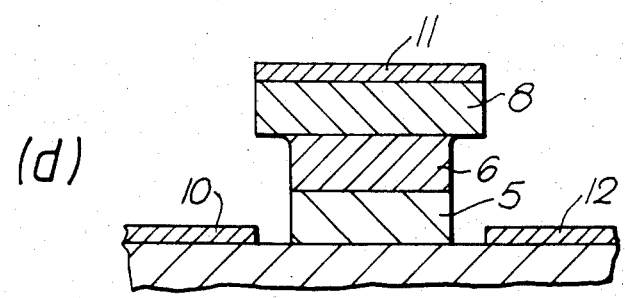

Conventional photolithographic techniques are used for masking preparatory for etching the substantially dumb-bell shaped configuration of layers 5, 6 and 7 as depicted in FIG. 1. With a masking layer 8 (FIG. 2) in position, a first stage of etching consists of etching with a strong etch, such as bromine methanol, that will etch the entire range of materials from InP to GaInAs. This etching is halted when the etching has penetrated into the p-type InP layer 5 as depicted in FIG. 2a. This etching produces no appreciable undercutting, and is succeeded by etching with ferricyanide which undercuts the edges of layer 7 as depicted in FIG. 2b. Then a third etch, an etch with hydrochloric phosphoric acid, is used to remove the rest of the InP layer 5 that is not masked by the remaining portions of the GaInAsP layer 6, as depicted in FIG. 2c. This configuration of semiconductor layers is then suitable for a subsequent metallization in which the overhang on each side separates the metallization layer into three distinct regions 10, 11 and 12 as depicted in FIG. 2d.

Reverting attention to FIG. 1, after etching the dumb-bell structure in the p-type layers 5, 6 and 7, further masking is employed for etching the n-type layers 3 and 4 to leave a pedestal 14 for the PIN diode, a rib 15 for the FET, and an island 16 for connecting the p-contact of the diode to a load resistor constructed in integrated form so as to minimise the stray capacitance of the connection between this resistor and the diode. This resistor may comprise a stripe region 17 of the n−-type layer rendered high resistance by proton bombardment. Alternatively it may be provided by a region of polysilicon (not shown) deposited in that area.

As previously explained with reference to FIG. 2, the undercutting of the p-type layer 7 separates a subsequent evaporated metal layer into electrically isolated areas. In the region of the FET area 20 forms the source contact, area 21 the gate contact, and area 22 the drain contact. Area 21 bridges the gap between the FET rib 15 and the PIN diode pedestal 14, and so also forms the p-contact of this diode, while a further area 23 on the n+ implanted region 2 of the substrate forms its n-contact.

Metallized area 21 also bridges the gap between the FET rib 15 and the island 16, and the far side of this island is ramped so that the metallization is continuous down the slope 24 so as to make contact with the proton bombarded region 17.

After the individual devices have been isolated by etching, and after metallization 23 (FIG. 1) has been applied to make contact to the n-side of the p-i-n diode, all the contact metallization is alloyed into the semiconductor by bringing the chip up to the required temperature, and additional metallization (not shown) is applied without appropriate masking (not shown) on top of the alloyed region where leads have to be attached and where increased conductivity is required.

The light to which the PIN diode is to respond may be directed upon the underside of the device to reach the depletion region via transmission through the substrate material 1. Alternatively the light may be directed upon the top side of the device, in which case it will normally be necessary to etch a window 25 through the p-contact metallization.

Figure 3:
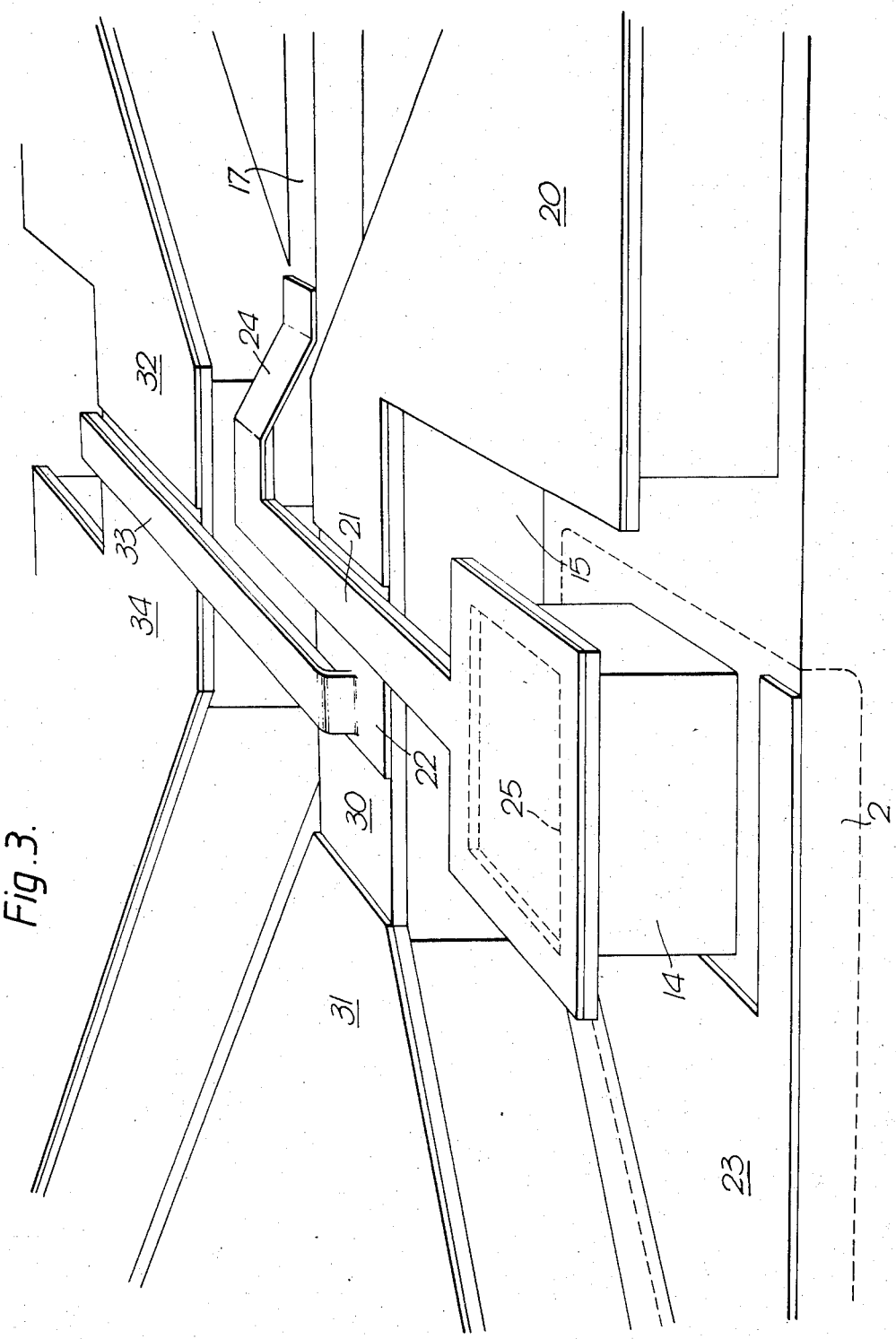
FIG. 3 is a schematic perspective view of an integrated circuit showing how a second FET may be added to this design of the circuit of FIG. 1.

Since the output impedance of the FET is not particularly low, the effect of stray capacitance on the output side can assume significance, and hence it is preferred to employ an integrated format in which an amplifier stage constituted by a second FET is formed integrally with the first FET and also a load resistor for the first FET. A suitable layout is depicted in FIG. 3.

The basic construction of the PIN diode and the first FET is essentially the same as that of FIG. 1, though the shapes have been slightly altered. Thus there is no longer an enlarged area for the island 16, and the proton bombarded region 17 providing the PIN diode bias resistor has been turned through 90°. The drain contact metallization of the first FET is connected to a load resistor provided by a second proton bombarded high resistance region 30, whose other contact is provided by a further metallization area 31. The second FET is constructed in essentially the same way as the first and has a source metallization area 32, a gate metallization area 33 and a drain metallization area 34. The gate metallization 33 of the second FET bridges the gap between the two FET's in the same manner that the gate metallisation 21 of the first FET bridges the gap between that FET and the PIN diode. In this way the metallization 33 provides a direct electrical connection between the drain of the first FET and the gate of the second.

Although the structure has been described throughout in such a form that the contacts for the gate, source and drain of the FET or FET's can be made by a self-aligned technique it is of course possible to fabricate them by two stages of conventional photolithographic masking registered to each other with the necessary degree of precision. Under these circumstances the semiconductor layers 6 and 7 that are required for the self-alignment procedure may be omitted from the structure.

What is claimed is:

1. A photodetector integrated circuit comprising:
 a field effect transistor including and a PIN photodiode connected to the gate contact of said field effect transistor;
 said field effect transistor being constructed as a rib like structure formed on a semiconductor substrate, said rib structure comprising semiconductive layers including a buffer layer and a channel layer with said gate contact formed between the source and drain contacts of said field effect transistor on said channel layer;
 said PIN photodiode being also constructed from said semiconductive layers and including a pair of contacts, said semiconductive layers of said PIN photodiode and said contacts of said PIN photodiode being spaced apart from said rib like structure of said field effect transistor on said substrate; and
 said contacts of said PIN photodiode being spaced apart by a greater distance than the spacing of said gate from said source and drain and said channel layer of said field effect transistor to provide said PIN photodiode with a capacitance per unit area that is small compared with the gate capacitance of said field effect transistor per unit area of said gate.

2. An integrated circuit in accordance with claim 1, wherein said semiconductive layers include an n-type layer that forms said channel layer of said field effect transistor, said channel layer having a thickness and covering an n-type or semi-insulating buffer layer that is thicker than said channel layer.

3. An integrated circuit in accordance with claim 2, wherein said buffer layer is approximately 1 micron thick.

4. An integrated circuit in accordance with claim 2, wherein said channel layer has a band gap and wherein said buffer layer is of a material having a band gap that is less than that of said channel layer.

5. An integrated circuit in accordance with claim 3, wherein said channel layer has a band gap and wherein said buffer layer is of a material having a band gap that is less than that of said channel layer.

6. An integrated circuit in accordance with claim 2, wherein said substrate has a band gap and wherein said buffer layer is of a material having a band gap that is less than that of the substrate of said integrated circuit.

7. An integrated circuit in accordance with claim 3, wherein said substrate has a band gap and wherein said buffer layer is of a material having a band gap that is less than that of the substrate of said integrated circuit.

8. An integrated circuit in accordance with claim 4, wherein said substrate has a band gap and wherein said buffer layer is of a material having a band gap that is less than that of the substrate of said integrated circuit.

9. An integrated circuit in accordance with claim 5, wherein said substrate has a band gap and wherein said buffer layer is of a material having a band gap that is less than that of the substrate of said integrated circuit.

10. An integrated circuit in accordance with claim 1, wherein said field effect transistor is a HEMT.

11. An integrated circuit in accordance with claim 2, wherein said field effect transistor is of a type in which source drain current conduction occurs in said channel layer rather than in said buffer layer.

12. An integrated circuit in accordance with claim 3, wherein said field effect transistor is of a type in which source drain current conduction occurs in said channel layer rather than in said buffer layer.

13. An integrated circuit in accordance with claim 4, wherein said field effect transistor is of a type in which source drain current conduction occurs in said channel layer rather than in said buffer layer.

14. An integrated circuit in accordance with claim 5, wherein said field effect transistor is of a type in which source drain current conduction occurs in said channel layer rather than in said buffer layer.

15. An integrated circuit in accordance with claim 6, wherein said field effect transistor is of a type in which source drain current conduction occurs in said channel layer rather than in said buffer layer.

16. An integrated circuit in accordance with claim 7, wherein said field effect transistor is of a type in which source drain current conduction occurs in said channel layer rather than in said buffer layer.

17. An integrated circuit in accordance with claim 8, wherein said field effect transistor is of a type in which source drain current conduction occurs in said channel layer rather than in said buffer layer.

18. An integrated circuit in accordance with claim 9, wherein said field effect transistor is of a type in which source drain current conduction occurs in said channel layer rather than in said buffer layer.

19. An integrated circuit in accordance with claims 1, 2, 3, 4, 5, 6, 7, 8, 9, 10, 11, 12, 13, 14, 15, 16, 17 or 18, wherein said layers are grown upon an indium phosphide substrate.

20. An integrated circuit in accordance with claim 1, wherein said field effect transistor is a JFET.

21. An integrated circuit in accordance with claim 11, wherein said semiconductive layers form a p-n junction which is bounded on its upper side by a stack of three layers whose compositions lie in the range from indium phosphide through gallium indium arsenide phosphide to gallium indium aresnide, and are such that the topmost of said three layers has a band gap in the region of 1.2 eV, the bottommost a substantially higher band gap than 1.2 eV, and the middle layer a substantially lower band gap than 1.2 eV.

22. An integrated circuit in accordance with claim 12, wherein said semiconductive layers form a p-n junction which is bounded on its upper side by a stack of three layers whose compositions lie in the range from indium phosphide through gallium indium arsenide phosphide to gallium indium arsenide, and are such that the topmost of said three layers has a band gap in the region of 1.2 eV, the bottommost a substantially higher band gap than 1.2 eV and the middle layer a substantially lower band gap than 1.2 eV.

23. An integrated circuit in accordance with claim 13, wherein said semiconductive layers form a p-n junction which is bounded on its upper side by a stack of three layers whose compositions lie in the range from indium phosphide through gallium indium arsenide phosphide to gallium indium arsenide, and are such that the topmost of said three layers has a band gap in the region of 1.2 eV, the bottommost a substantially higher band gap than 1.2 eV and the middle layer a substantially lower band gap than 1.2 eV.

24. An integrated circuit in accordance with claim 14, wherein said semiconductive layers form a p-n junction which is bounded on its upper side by a stack of three layers whose compositions lie in the range from indium phosphide through gallium indium arsenide phosphide to gallium indium arsenide, and are such that the topmost of said three layers has a band gap in the region of 1.2 eV, the bottommost a substantially higher band gap than 1.2 eV and the middle layer a substantially lower band gap than 1.2 eV.

25. An integrated circuit in accordance with claim 15, wherein said semiconductive layers form a p-n junction which is bounded on its upper side by a stack of three layers whose compositions lie in the range from indium phosphide through gallium indium arsenide phosphide to gallium indium arsenide, and are such that the topmost of said three layers has a band gap in the region of 1.2 eV, the bottommost a substantially higher band gap than 1.2 eV and the middle layer a substantially lower band gap than 1.2 eV.

26. An integrated circuit in accordance with claim 16, wherein said semiconductive layers form a p-n junction which is bounded on its upper side by a stack of three layers whose compositions lie in the range from indium phosphide through gallium indium arsenide phosphide to gallium indium arsenide, and are such that the topmost of said three layers has a band gap in the region of 1.2 eV, the bottommost a substantially higher band gap than 1.2 eV and the middle layer a substantially lower band gap than 1.2 eV.

27. An integrated circuit in accordance with claim 17, wherein said semiconductive layers form a p-n junction which is bounded on its upper side by a stack of three layers whose compositions lie in the range from indium phosphide through gallium indium arsenide phosphide to gallium indium arsenide, and are such that the topmost of said three layers has a band gap in the region of 1.2 eV, the bottommost a substantially higher band gap than 1.2 eV and the middle layer a substantially lower band gap than 1.2 eV.

28. An integrated circuit in accordance with claim 18, wherein said semiconductive layers form a p-n junction which is bounded on its upper side by a stack of three layers whose compositions lie in the range from indium phosphide through gallium indium arsenide phosphide to gallium indium arsenide, and are such that the topmost of said three layers has a band gap in the region of 1.2 eV, the bottommost a substantially higher band gap than 1.2 eV and the middle layer a substantially lower band gap than 1.2 eV.

29. An integrated circuit in accordance with claim 1 comprising:
   a bias resistor coupled to said PIN diode.

30. An integrated circuit in accordance with claim 29 further including a second field effect transistor and a second load resistor:
   said second field effect transistor having a gate connected to said drain of said first field effect transistor; and
   said second load resistor being connected to said drain of said field effect transistor.

* * * * *